(12) United States Patent
Oboukhov et al.

(10) Patent No.: US 11,487,611 B2
(45) Date of Patent: Nov. 1, 2022

(54) LDPC ENCODING FOR MEMORY CELLS WITH ARBITRARY NUMBER OF LEVELS

(71) Applicant: Western Digital Technologies, Inc., San Jose, CA (US)

(72) Inventors: Iouri Oboukhov, Rochester, MN (US); Richard Galbraith, Rochester, MN (US); Jonas Goode, Lake Forest, CA (US); Niranjay Ravindran, Rochester, MN (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/183,153

(22) Filed: Feb. 23, 2021

(65) Prior Publication Data

US 2022/0107865 A1 Apr. 7, 2022

Related U.S. Application Data

(60) Provisional application No. 63/086,962, filed on Oct. 2, 2020.

(51) Int. Cl.
*G06F 11/10* (2006.01)
*H03M 13/11* (2006.01)

(52) U.S. Cl.
CPC ...... *G06F 11/1044* (2013.01); *G06F 11/1068* (2013.01); *H03M 13/1171* (2013.01)

(58) Field of Classification Search
CPC ........... H03M 13/1171; H03M 13/1102; G06F 11/1068; G06F 11/1044; G06F 11/048
See application file for complete search history.

(56) References Cited

U.S. PATENT DOCUMENTS

| | | | | |
|---|---|---|---|---|
| 6,226,769 B1* | 5/2001 | Schuster | ................ | H04L 1/008 |
| | | | | 714/755 |
| 8,234,545 B2* | 7/2012 | Shalvi | ................ | G06F 11/1068 |
| | | | | 714/768 |
| 8,861,267 B2* | 10/2014 | Seol | ........................ | G11C 16/10 |
| | | | | 365/185.11 |
| 9,189,329 B1* | 11/2015 | Zhu | ....................... | G06F 11/1012 |
| 9,245,653 B2* | 1/2016 | Hyun | ................. | G11C 16/0483 |
| 9,971,537 B1* | 5/2018 | Kannan | ................. | G06F 3/0616 |
| 10,997,019 B1* | 5/2021 | Li | ........................ | G06F 11/1044 |
| 2004/0028002 A1* | 2/2004 | Eroz | ................... | H03M 13/1111 |
| | | | | 370/316 |
| 2010/0202198 A1* | 8/2010 | Kim | ................... | G11C 16/3427 |
| | | | | 365/185.18 |

(Continued)

*Primary Examiner* — Steve N Nguyen
(74) *Attorney, Agent, or Firm* — Patterson & Sheridan, LLP; Steven H. VerSteeg

(57) ABSTRACT

The present disclosure generally relates to applying LDPC coding to memory cells with an arbitrary number of levels. Modulation code is applied to a first portion of user bits. The coded user data is stored in a first modulation block. Parity bits are then generated for the first portion of user bits. The parity bits are then stored in a second modulation block different from the first modulation block. Modulation code is then applied to a second portion of user bits which are stored in the second modulation block. Parity bits are then generated for the second portion of user bits and stored in a third modulation block. The parity bits are thus embedded in a separate modulation block from the modulation block where the user data is stored.

20 Claims, 8 Drawing Sheets

(56) References Cited

U.S. PATENT DOCUMENTS

| | | | |
|---|---|---|---|
| 2011/0283166 A1* | 11/2011 | Kim | G06F 11/106 |
| | | | 714/773 |
| 2012/0185747 A1* | 7/2012 | Kim | H03M 13/618 |
| | | | 714/755 |
| 2012/0304037 A1* | 11/2012 | Reddy | G06F 11/1012 |
| | | | 714/763 |
| 2013/0111294 A1* | 5/2013 | Tan | H03M 5/145 |
| | | | 714/755 |
| 2014/0164876 A1* | 6/2014 | Gasanov | H03M 5/12 |
| | | | 714/769 |
| 2016/0164632 A1* | 6/2016 | Oveis Gharan | H03M 13/2921 |
| | | | 714/776 |
| 2017/0337103 A1* | 11/2017 | Royer, Jr. | G06F 3/0619 |
| 2019/0356335 A1* | 11/2019 | Liu | H04L 1/0057 |

* cited by examiner

LDPC ENCODING FOR MEMORY CELLS WITH ARBITRARY NUMBER OF LEVELS

CROSS-REFERENCE TO RELATED APPLICATIONS

This application claims benefit of U.S. provisional patent application Ser. No. 63/086,962, filed Oct. 2, 2020, which is herein incorporated by reference.

BACKGROUND OF THE DISCLOSURE

Field of the Disclosure

Embodiments of the present disclosure generally relate to applying LDPC coding to memory cells with an arbitrary number of levels.

Description of the Related Art

Memory devices, such as NAND memory cells, are multi-state objects that store binary information. To simplify binary arithmetic, the number of levels in a cell is chosen as an integer power of 2 (e.g., 2, 4, 8, 16, etc.). Efforts have been made to create cells with any number of levels so that non-integer power of 2 number of cell levels can be achieved.

For such a non-integer power of 2 situation, user data encoding can be simple by changing the user database from 2-ary to L-ary where L is the number of cell levels. The user data is thus easily encoded. However, the LDPC parity calculation is binary, not non-integer power of 2. Thus, LDPC parity information presents a problem in a non-integer power of 2 number of cell levels situation.

Because the LDPC parity calculation is binary, there is a problem of how to write binary information in an L-level cell without encoding and loosing data capacity. The LDPC parity for a non-integer power of 2 number of cell levels situation requires additional storage capacity than would be needed in an integer power of 2 number of cell levels situation. Alternatively, the LDPC parity data can be encoded, which is not desirable.

Therefore, there is a need in the art for a manner of storing LDPC parity data for non-integer power of 2 number of cell levels without encoding the LDPC parity data or utilizing too much storage capacity.

SUMMARY OF THE DISCLOSURE

The present disclosure generally relates to applying LDPC coding to memory cells with an arbitrary number of levels. Modulation code is applied to a first portion of user bits. The coded user data is stored in a first modulation block. Parity bits are then generated for the first portion of user bits. The parity bits are then stored in a second modulation block different from the first modulation block. Modulation code is then applied to a second portion of user bits which are stored in the second modulation block. Parity bits are then generated for the second portion of user bits and stored in a third modulation block. The parity bits are thus embedded in a separate modulation block from the modulation block where the user data is stored.

In one embodiment, a data storage device comprises: one or more memory devices; and a controller coupled to the one or more memory devices, wherein the controller is configured to: apply modulation coding to a first set of user data; write the modulated first set of user data to a first modulation block; generate first parity data for the modulated first set of user data; and write the first parity data to a second modulation block.

In another embodiment, a data storage device comprises: one or more memory devices; and a controller coupled to the one or more memory devices, wherein the controller is configured to: generate parity data for a first set of modulated user data; and embed the parity data with a second set of modulated user data that is different from the first set of modulated user data.

In another embodiment, a data storage device comprises: one or more memory devices; means to store modulated first user data; and means to store parity data for the modulated first user data in a location different than the modulated first user data.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to applying LDPC coding to memory cells with an arbitrary number of levels. Modulation code is applied to a first portion of user bits. The coded user data is stored in a first modulation block. Parity bits are then generated for the first portion of user bits. The parity bits are then stored in a second modulation block different from the first modulation block. Modulation code is then applied to a second portion of user bits which are stored in the second modulation block. Parity bits are then generated for the second portion of user bits and stored in a third modulation block. The parity bits are thus embedded in a separate modulation block from the modulation block where the user data is stored.

Figure 1:
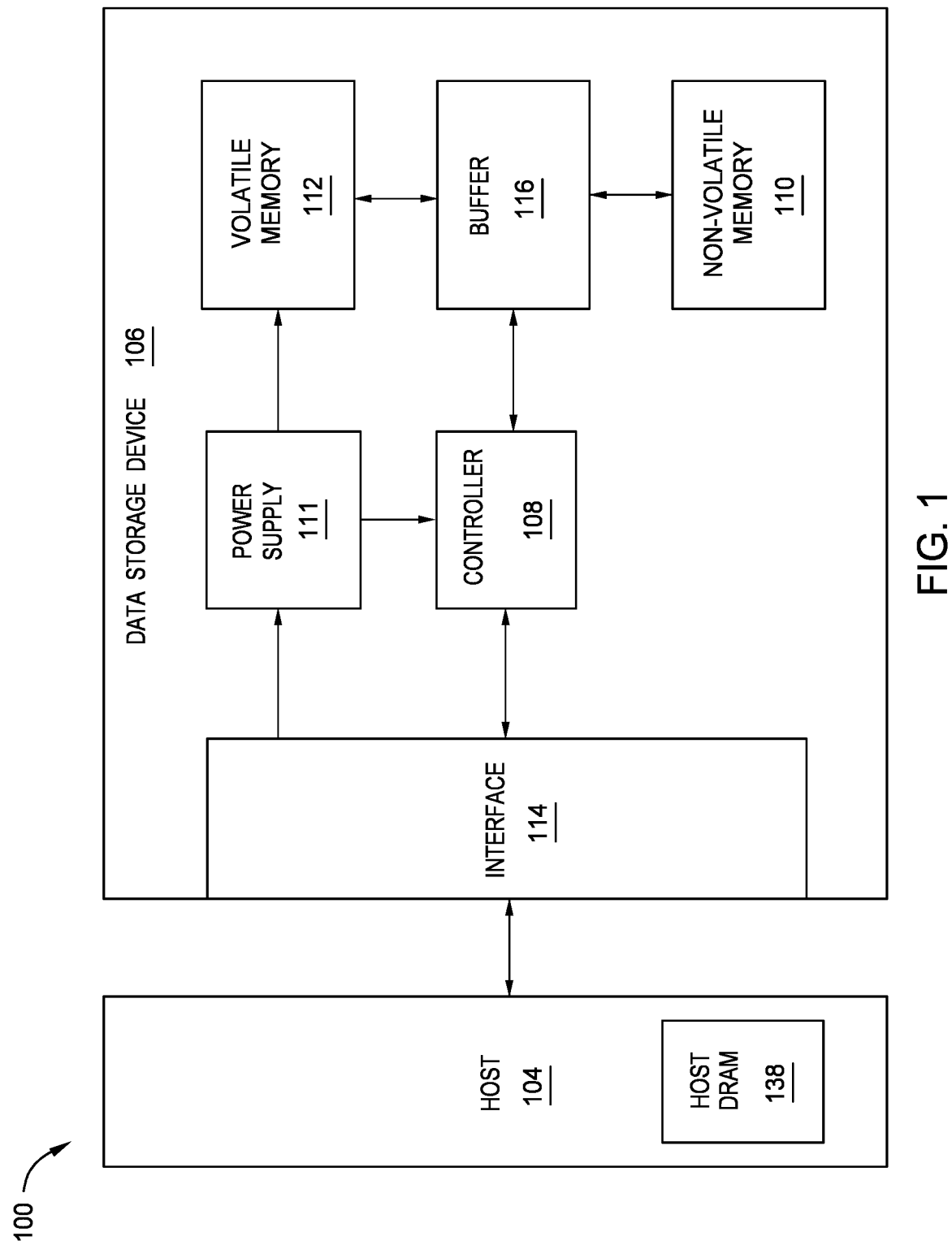
FIG. 1 is a schematic block diagram illustrating a storage system in which data storage device may function as a storage device for a host device, according to disclosed embodiments.

FIG. 1 is a schematic block diagram illustrating a storage system 100 in which data storage device 106 may function as a storage device for a host device 104, according to disclosed embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, an interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106, or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered) to a motherboard of the host device 104.

The interface 114 of the data storage device 106 may include one or both of a data bus for exchanging data with the host device 104 and a control bus for exchanging commands with the host device 104. The interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. The electrical connection of the interface 114 (e.g., the data bus, the control bus, or both) is electrically connected to the controller 108, providing electrical connection between the host device 104 and the controller 108, allowing data to be exchanged between the host device 104 and the controller 108. In some examples, the electrical connection of the interface 114 may also permit the data storage device 106 to receive power from the host device 104. For example, as illustrated in FIG. 1, the power supply 111 may receive power from the host device 104 via the interface 114.

The NVM 110 may include a plurality of memory devices. NVM 110 may be configured to store and/or retrieve data. For instance, a memory device of NVM 110 may receive data and a message from the controller 108 that instructs the memory device to store the data. Similarly, the memory device of NVM 110 may receive a message from the controller 108 that instructs the memory device to retrieve data. In some examples, each of the memory devices may be referred to as a die. In some examples, a single physical chip may include a plurality of dies (i.e., a plurality of memory units). In some examples, each memory device may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory device of NVM 110 may include any type of non-volatile memory devices, such as flash memory devices, phase-change memory (PCM) devices, resistive random-access memory (ReRAM) devices, magnetoresistive random-access memory (MRAM) devices, ferroelectric random-access memory (F-RAM), holographic memory devices, and any other type of non-volatile memory devices.

The NVM 110 may comprise a plurality of flash memory devices. NVM Flash memory devices may include NAND or NOR based flash memory devices and may store data based on a charge contained in a floating gate of a transistor for each flash memory cell. In NVM flash memory devices, the flash memory device may be divided into a plurality of dies, where each die of the plurality of dies includes a plurality of blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The data storage device 106 includes a power supply 111, which may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via the interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, supercapacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The data storage device 106 also includes volatile memory 112, which may be used by controller 108 to store information. Volatile memory 112 may include one or more volatile memory devices. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

The data storage device 106 includes a controller 108, which may manage one or more operations of the data storage device 106. For instance, the controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. The controller 108 may determine at least one operational characteristic of the storage system 100 and store the at least one operational characteristic to the NVM 110. In some embodiments, when the data storage device 106 receives a write command from the host device 104, the controller 108 temporarily stores the data associated with the write command in the internal memory or write buffer 116 before sending the data to the NVM 110.

FIGS. 2A-2L are schematic illustrations of embedding parity in a modulation block, according to disclosed embodiments. In the illustrations of FIGS. 2A-2L, the term "data" refers to user data, whereas the term "coded data" refers to modulated data that excludes parity data. Modulated data is user data encoded with modulation code. The data storage device, such as the data storage device 106 of FIG. 1, may include a modulation encoder engine and a modulation decoder engine, where the modulation encoder engine is configured to encode user data with modulation code and the modulation decoder engine is configured to decode the modulated user data so that the user data may be read by a host, such as the host 104 of FIG. 1.

In some embodiments, the modulation encoder engine and the modulation decoder engine may be a component of the controller. In other embodiments, the modulation encoder engine and the modulation decoder engine may be a separate component, where user data passes through the modulation encoder engine when writing from the controller to the NVM and through the modulation decoder engine when reading from the NVM to the controller. The modulation encoder engine and the modulation decoder engine may be a single unit, in one embodiment. The modulation encoder engine and the modulation decoder engine may be separate units, in other embodiments.

Figure 2A:
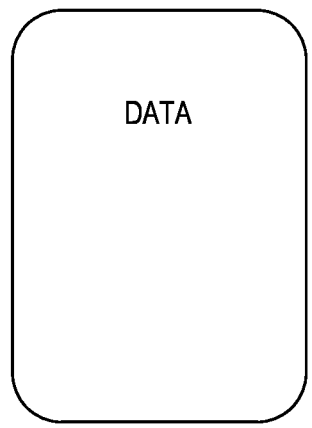
FIGS. 2A-2L are schematic illustrations of embedding parity in a modulation block, according to disclosed embodiments.
Figure 2B:
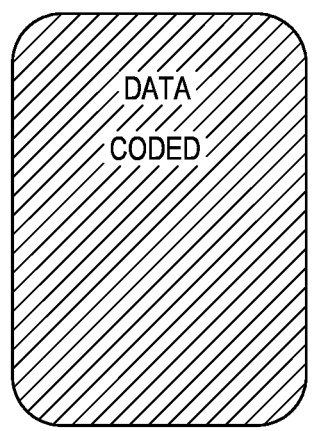
Figure 2C:
Figure 2C:
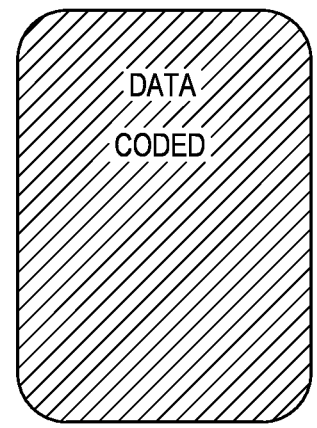

In FIG. 2A, a first set of user data is received by a controller, such as the controller 108 of FIG. 1. In FIG. 2B, modulation coding is applied to the first set of user data, where the first set of user data is a modulated first set of user data. The modulated first set of user data is programmed to a first modulation block in the NVM, such as the NVM 110 of FIG. 1. In FIG. 2C, first parity data for the modulated first set of user data is generated. The first parity data is written to a second modulation block prior to storing a second set of user data in the second modulation block. The parity data, such as the first parity data, may include any number of bits, such as about 3 parity bits, that correspond with a set of user data, such as the first set of user data, such that the user data may be recovered in case of program failures, bit error accumulation, and the like.

Figure 2D:
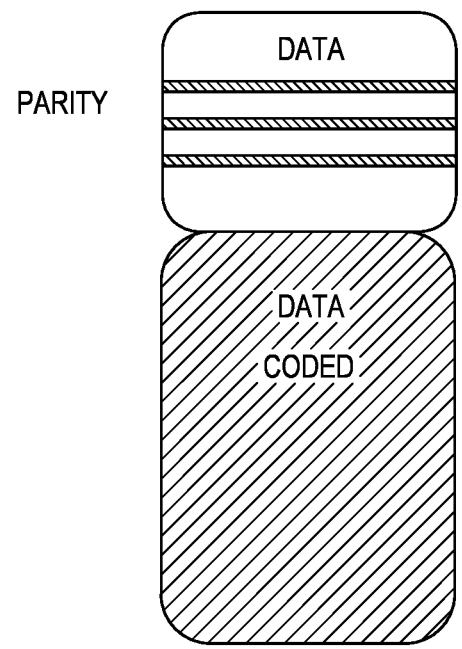
Figure 2E:
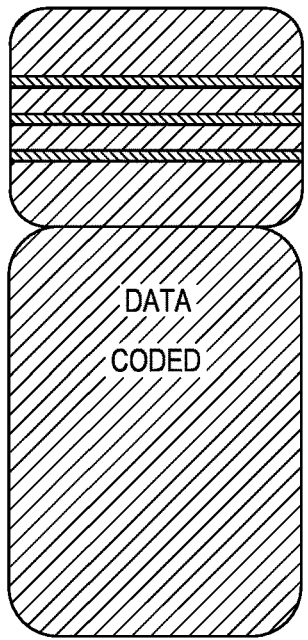

In FIG. 2D, the second set of user data, different from the first set of user data, is written to the second modulation block, where the second set of user data includes gaps for the first parity data. Furthermore, the second modulation block includes the second set of user data and the first parity data, where the second set of user data is not modulated data and the first parity data is not encoded. In FIG. 2E, the second set of user data is encoded with modulation data, such that the second set of user data is a modulated second set of user data. The modulated second set of user data is different from the modulated first set of user data. Furthermore, the first parity data embedded in the modulated second set of data may be about 30% of the total data of the second modulation block.

Figure 2G:
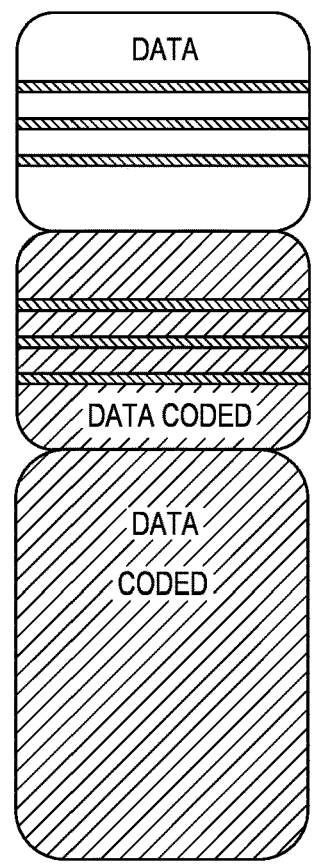
Figure 2F:
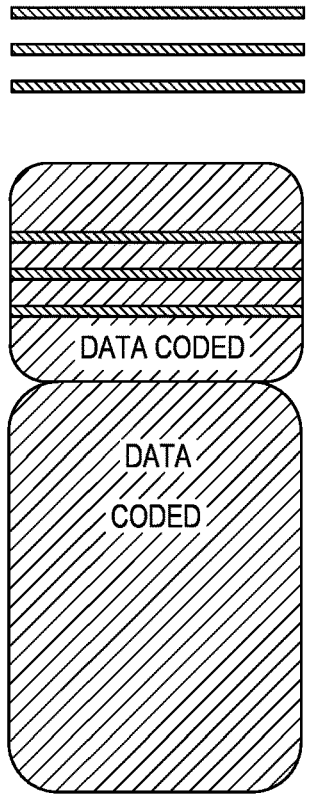
Figure 2H:
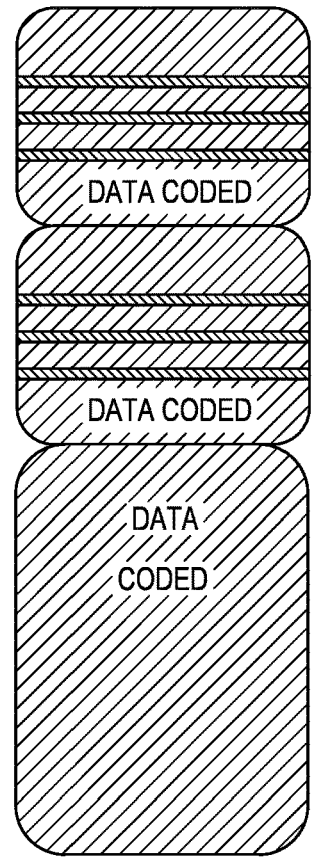

In FIG. 2F, second parity data for the modulated second set of user data is generated. The second parity data is written to a third modulation block prior to storing a third set of user data in the third modulation block. In FIG. 2G, the third set of user data, different from the second set of user data, is written to the third modulation block, where the third set of user data includes gaps for the second parity data. Furthermore, the third modulation block includes the third set of user data and the second parity data, where the third set of user data is not modulated data and the second parity data is not encoded. In FIG. 2H, the third set of user data is encoded with modulation data, such that the third set of user data is a modulated third set of user data. The modulated third set of user data is different from the modulated second set of user data. Furthermore, the second parity data embedded in the modulated third set of data may be about 30% of the total data of the third modulation block.

Figure 2I:
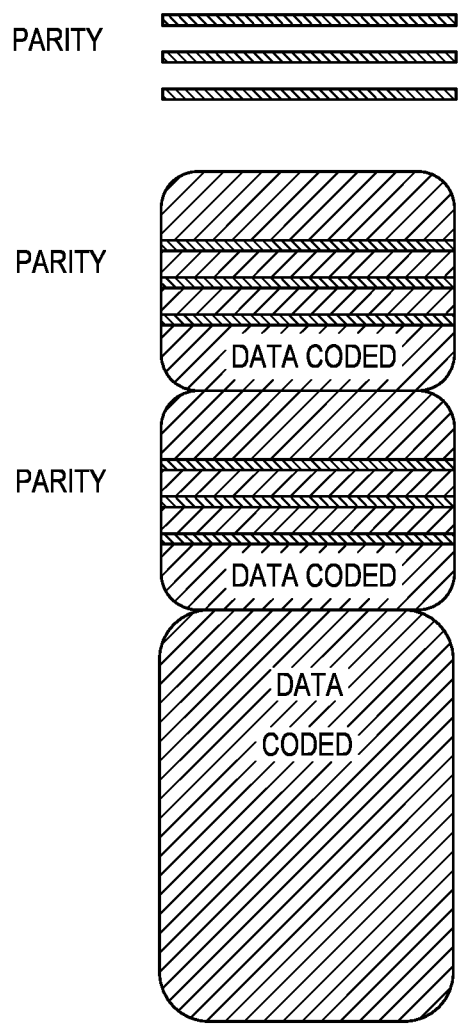
Figure 2J:
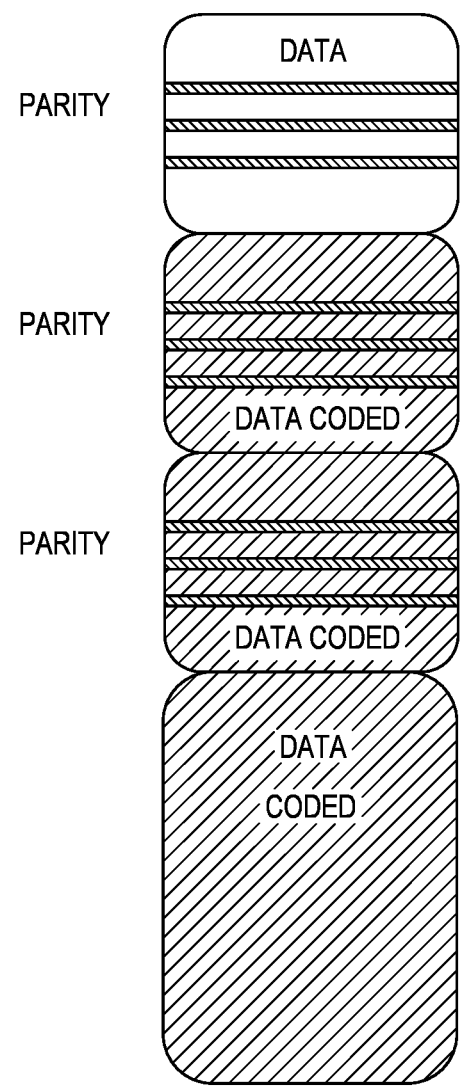
Figures 2K, 2L:
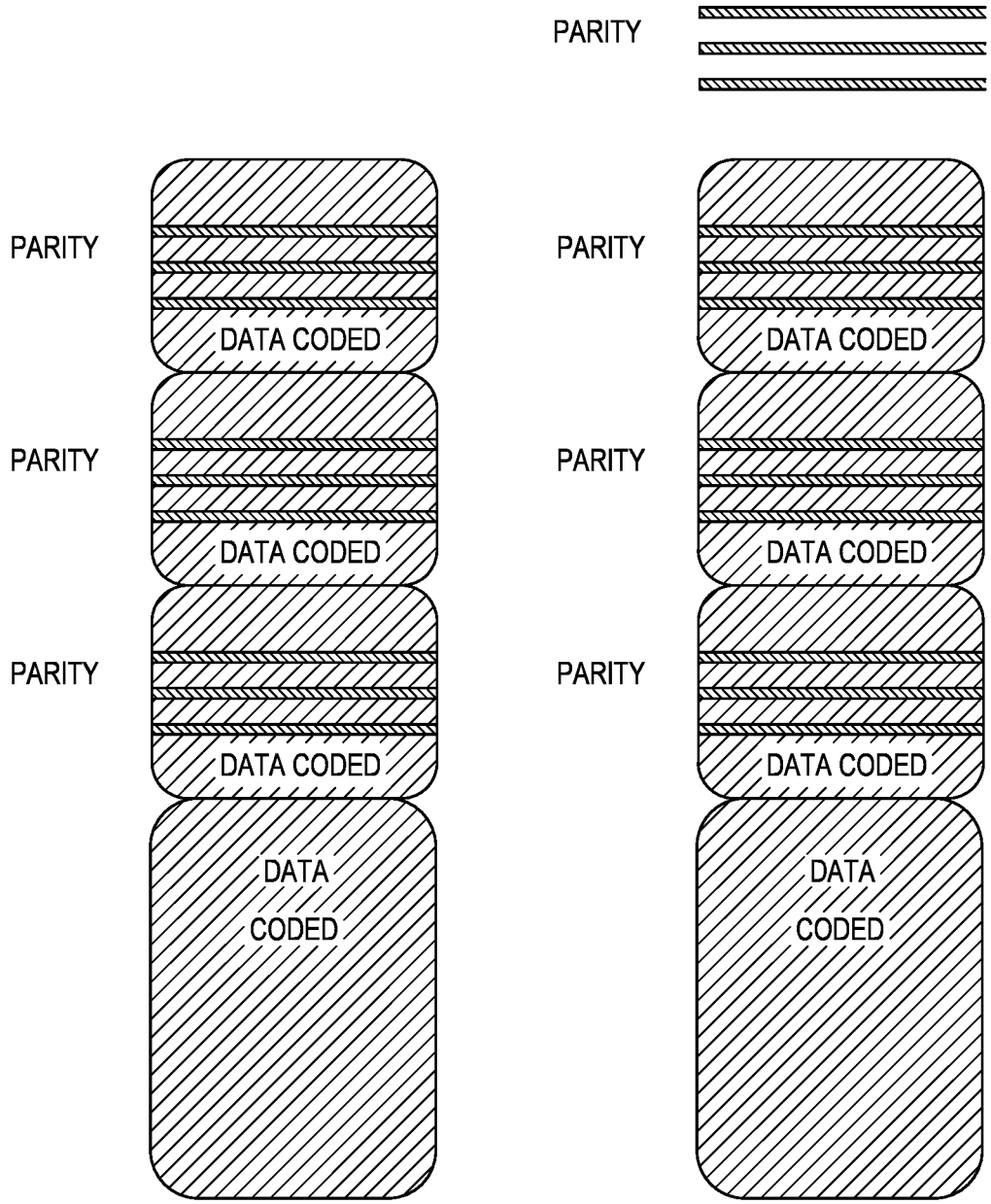

In FIG. 2I, third parity data for the modulated third set of user data is generated. The third parity data is written to a fourth modulation block prior to storing a fourth set of user data in the fourth modulation block. In FIG. 2J, the fourth set of user data, different from the third set of user data, is written to the fourth modulation block, where the fourth set of user data includes gaps for the third parity data. Furthermore, the fourth modulation block includes the fourth set of user data and the third parity data, where the fourth set of user data is not modulated data and the third parity data is not encoded. In FIG. 2K, the fourth set of user data is encoded with modulation data, such that the fourth set of user data is a modulated fourth set of user data. The modulated fourth set of user data is different from the modulated third set of user data. Furthermore, the third parity data embedded in the modulated fourth set of data may be about 30% of the total data of the fourth modulation block.

In FIG. 2L, fourth parity data for the modulated fourth set of user data is generated. The fourth parity data is written to a fifth modulation block. However, because there is no user data left to program to the fifth modulation block, the fourth parity data is not embedded in user data or modulated data. The fourth parity data may be about 1% of the data available to write to the fifth modulation block. It is to be understood that while the fifth modulation block is exemplified as the last modulation block and that while the fourth parity data is the last parity data written to the last modulation block, additional parity data, user data, and modulation blocks may be between the last modulated block and the previous modulated blocks. For example, the NVM may have an n-number of modulation blocks, where "n" refers to an integer value. Furthermore, though the fifth modulation block is exemplified as the last modulation block, additional data may be received, where additional parity data and the modulated data may be written to the fifth modulation block, the sixth modulation block, and so-forth.

Figure 3:
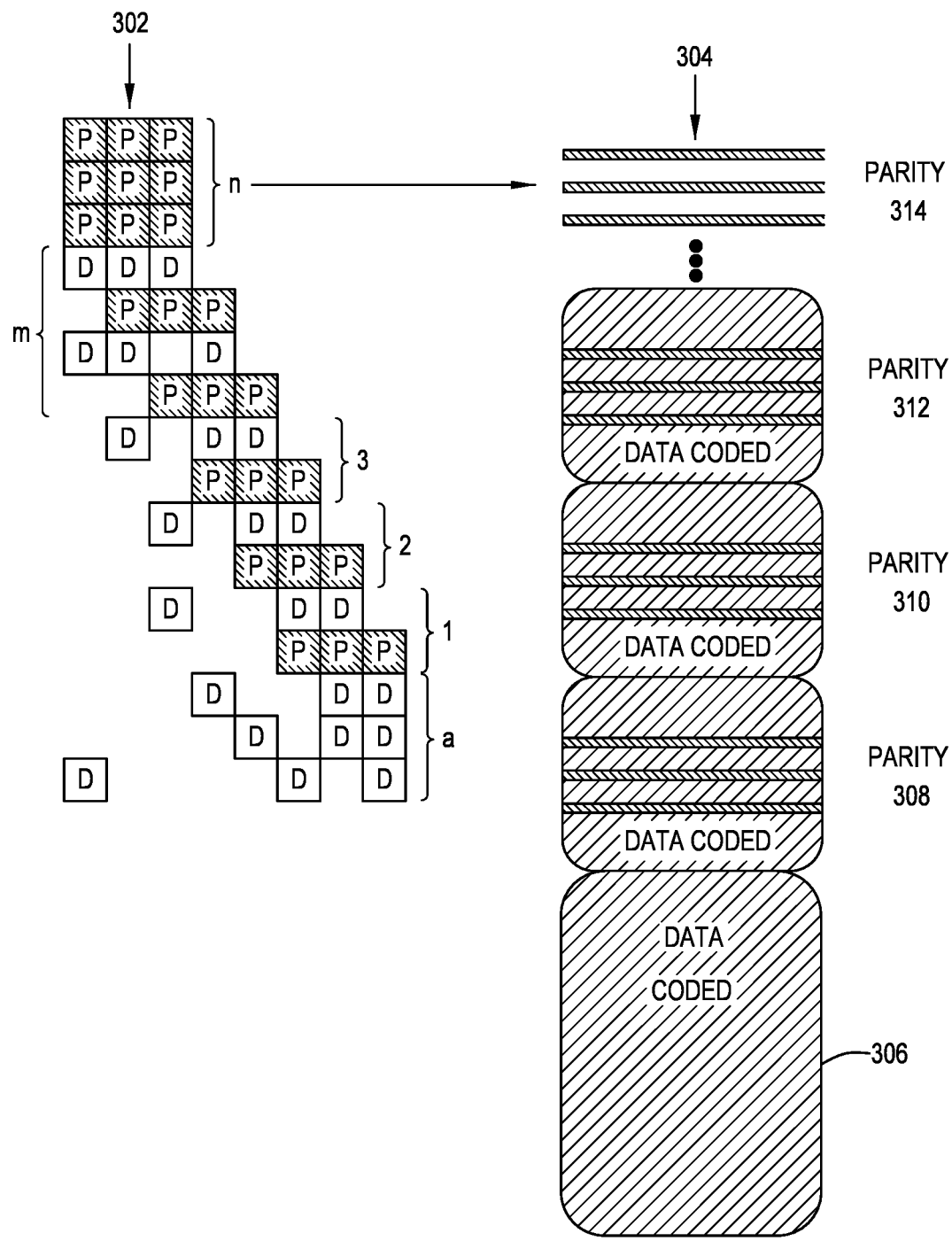
FIG. 3 is a schematic illustration of a triangular LDPC H-matrix, according to disclosed embodiments.

FIG. 3 is a schematic illustration of a triangular low density parity check (LDPC) horizontal (H)-matrix 302, according to disclosed embodiments. Aspects of the embedding parity in a modulation block of FIGS. 2A-2L may be similar to the triangular LDPC H-matrix illustrated in FIG. 3. For example, the set of modulated blocks 304 may be the embodiment illustrated in FIG. 2L.

The triangular LDPC H-matrix 302 construction may be implemented to allow for the embedded parity in the modulation block coding of the set of modulated blocks 304. For example, the parity bits (P) may be the parity data exemplified in FIGS. 2A-2L. The parity bits may be computed sequentially using larger chunks of previously programmed user data. The H-matrix construction of the triangular LDPC H-matrix 302 may help generate parity bits sequentially and embed generated parity in the modulation blocks step by step.

User data is indicated by "D" in the triangular LDPC H-matrix 302. The triangular LDPC H-matrix 302 includes a set of rows and a set of columns. Each column has either parity bits or user data bits, where the number of bits per column is about three. The listed number of bits per column is not intended to be limiting, but to provide an example of a possible embodiment. Each row includes at least three user data bits and at least one parity bit. In one embodiment, each row includes a maximum of about 30 user data bits.

The first section "a" of the triangular LDPC H-matrix 302 corresponds to the modulated first set of user data 306. The second section "1" of the triangular LDPC H-matrix corresponds to the modulated second set of user data 308, where the parity bits are the parity stripes associated with the user data of the modulated first set of user data 306. The third section "2" of the triangular LDPC H-matrix 302 corresponds to the modulated third set of user data 310, where the parity bits are the parity stripes associated with the user data of the modulated second set of user data 308. The fourth section "3" of the triangular LDPC H-matrix 302 corresponds to the modulated fourth set of user data 312, where the parity bits are the parity stripes associated with the user data of the modulated third set of user data 310.

The section "m" of the triangular LDPC H-matrix 302 includes additional parity bits and user data bits corresponding to additional modulated blocks of modulated data and parity data. The section "n" is the final section of the triangular LDPC H-matrix 302, where the final section includes parity bits. The final section "n" does not include any modulated user data and corresponds to parity data 314. Thus, the final section "n" may include about 1% of the total size of the set of modulated blocks 304.

Figure 4:
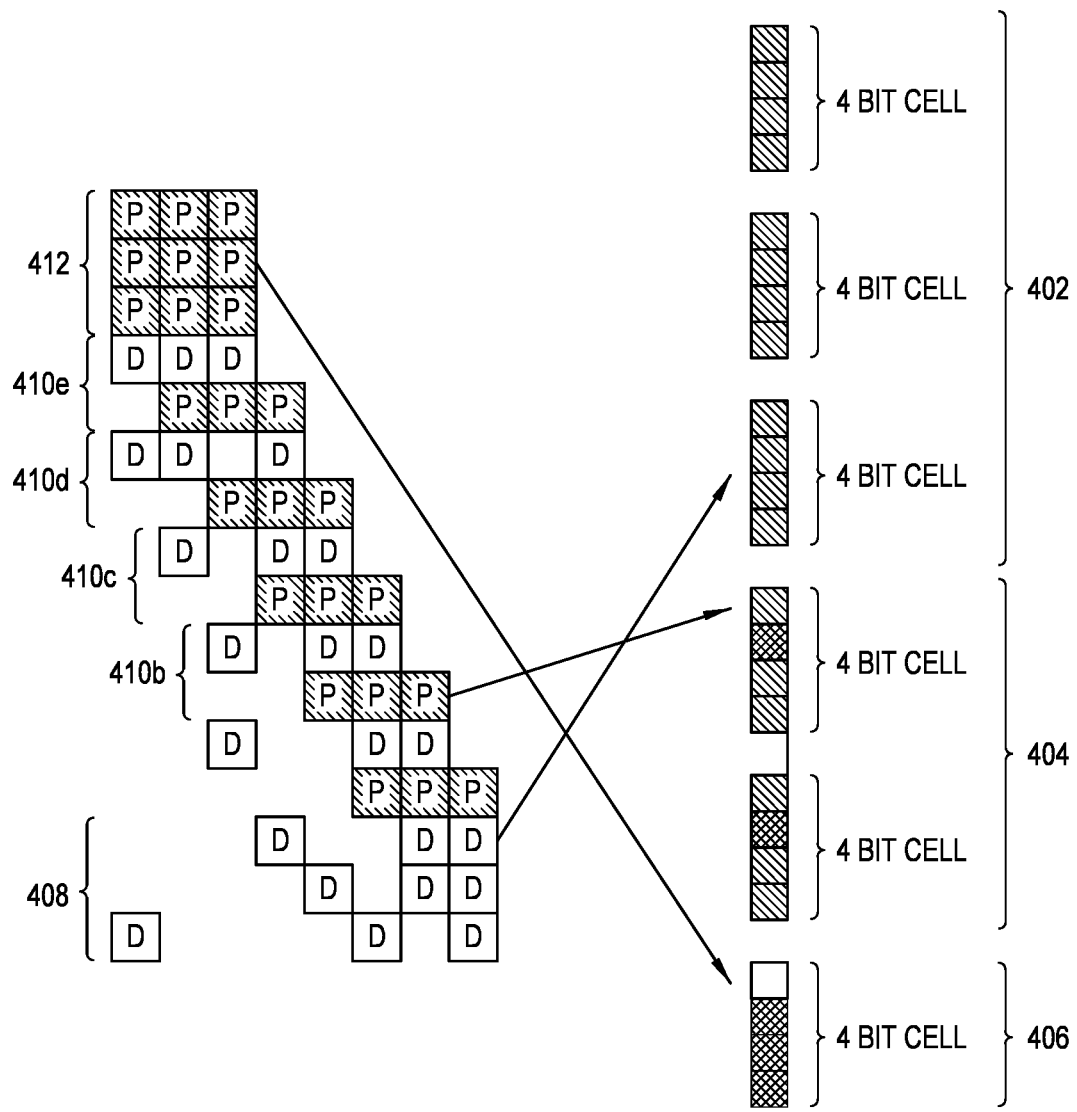
FIG. 4 is schematic illustration of L-level memory cell encoding, according to disclosed embodiments.

FIG. 4 is schematic illustration of L-level memory cell encoding, according to disclosed embodiments. Aspects of triangular LDPC H-matrix 302 of FIG. 3 may be similar to the L-level memory cell encoding of FIG. 4. For example, the first section "a" of FIG. 3 may be the data section 408, the second section "1" of FIG. 3 may be the first embedded parity section 410a, the third section "2" of FIG. 3 may be the second embedded parity section 410b, the fourth section "3" of FIG. 3 may be the third embedded parity section 410c, and the section "m" of FIG. 3 may be the combined fourth embedded parity section 410d and the fifth embedded parity section 410e. The final section "n" of FIG. 3 may be the parity bit section 412. Furthermore, the user data bits are denoted by "D" and the parity bits are denoted by "P".

The data section 408 is encoded with modulation code. The data section 408 may be a 4 bit cell, represented by a first section 402. The embedded parity sections 410a-410e may also be a 4 bit cell, where one of the cells are associated with the parity bits, as illustrated by the second section 404. The parity bit section 412 may be represented by the third section 406, where the number of bit cells is constrained to n−1 bits of the cell. For example, for a 4 bit cell, as shown in third section 406, the parity bits are constrained to 3 bit cells out of the 4 bit cells. Furthermore, the modulation constraint and the modulation encoding may be implemented on each page of the bit cells. The listed number of bit cells are not intended to be limiting, but to provide an example of a possible embodiment.

For example, the memory cells (i.e., bit cells) may be a 5 bit cell, such as a penta-level cell (PLC) architecture or even a 3 bit cell. Each memory cell may include a plurality of levels. The number of levels of the plurality of levels may be a non-integer power of two. The number of levels in a cell may be defined by hardware and supported in binary domain by modulation code with little to no code penalty. For example, in the 5 bit cell example, the number of levels is greater than or equal to about 20 and less than or equal to about 21. For a 20 or 21 level cell including user data bits, the combination of the 20 level cells and the 21 level cells may be about 70% of the total data stored on the data storage device or the memory cell. Furthermore, when parity data is embedded in the modulation code, such as illustrated in the second section 404, about 30% of the total data stored on the data storage device may be stored in the second section 404. Because the parity bit section 412 does not include user data bits, in a 5 bit cell, the bit cells are constrained to 4 bit cells, where the data size of the parity bit section 412 may be about 1% of the total data of the data storage device or the memory cell.

It is to be understood that the first section 402, which corresponds to the coded data without parity data embedded therein, could be modulated most efficiently at the Shannon limit. Second section 404, which corresponds to coded data with parity data embedded therein, could be modulated with a higher code penalty than first section 402, but still within the Shannon limit taking into account the additional constraint added by fixed parity bits. Third section 406, which corresponds to parity data that is not embedded in any coded data, will have the poorest efficiency of modulation, but because the third section 406 (i.e., last section) will be very small (i.e., approximately 1 percent of data), a higher modulation code penalty can be tolerated.

Figure 5:
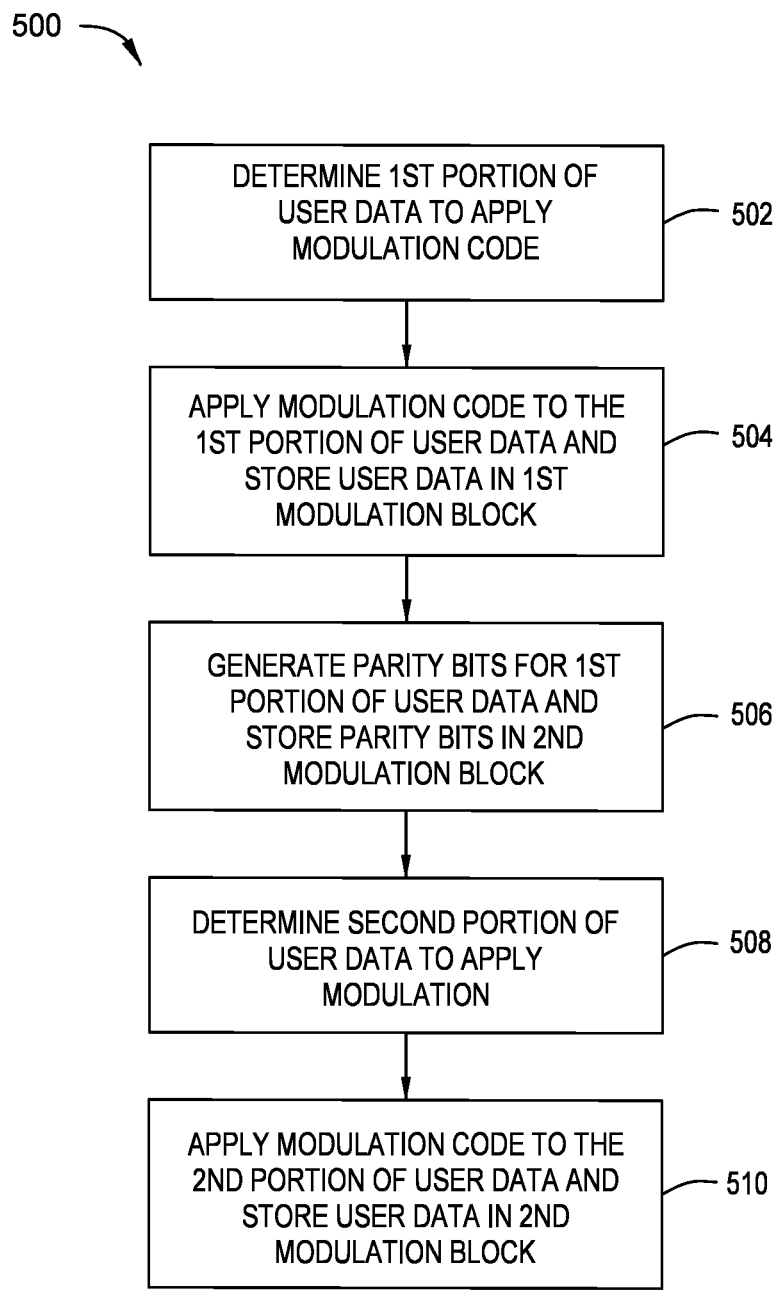
FIG. 5 is a flowchart illustrating a method of applying LDPC coding to memory cells with arbitrary number of levels, according to disclosed embodiments.

FIG. 5 is a flowchart illustrating a method 500 of applying LDPC coding to memory cells with arbitrary number of levels, according to disclosed embodiments. At block 502, the controller, such as the controller 108 of FIG. 1 determines the first portion of the user data to apply modulation code to. The first portion of the user data does not include any parity data since parity data is generated for previously stored data. At block 504, the modulation code is applied to the first portion of the user data and the first modulated user data is stored in a first modulation block. For example, the first modulated user data may be the data section 408 of FIG. 4.

At block 506, parity bits are generated for the first modulated user data and stored in a second modulation block. At block 508, the controller determines a second portion of the user data to apply modulation coding to. At block 510, the modulation code is applied to the second portion of the user data and the second modulated data is stored in the second modulation block. The second modulated data is programmed to the second modulation block such that the parity data generated at block 506 is embedded in the second modulated data. Parity data for the currently modulated data in the current modulation block is generated and written to the next modulation block.

By using modulation code, user data is encoded in a first modulation block while LDPC parity data for the encoded user data is embedded in a different modulation block. The LDPC parity data is not encoded and utilizes far less storage capacity than a non-modulated situation. Thus, a manner of storing LDPC parity data for non-integer power of 2 number of cell levels without encoding the LDPC parity data or utilizing too much storage capacity is achieved.

In one embodiment, a data storage device comprises: one or more memory devices; and a controller coupled to the one or more memory devices, wherein the controller is configured to: apply modulation coding to a first set of user data; write the modulated first set of user data to a first modulation block; generate first parity data for the modulated first set of user data; and write the first parity data to a second modulation block. The second modulation block contains a second set of user data that is different from the modulated first set of user data. The first parity data is written to the second modulation block prior to storing the second set of user data in the second modulation block. The second modulation block contains no modulated data. The first parity data is not encoded. The first parity data is embedded in the second modulation block with modulated data that does not correspond to the modulated first set of user data. The one or more memory devices comprises a plurality of levels and wherein a number of levels of the plurality of levels is a non-integer power of 2. The number of levels is configured as a first part having a first number of level cells, a second part having a second number of level cells that is one more than the first number of level cells, and wherein the total number of levels is a non-integer such that storage areal density can be fine tuned. Each cell comprises 5 bits. Parity data embedded with user data in a modulation block comprises about 30% of all data and is modulated at a Shannon limit taking into account a fixed parity bit constraint. Parity data not embedded with user data in a modulation block comprises about 1% of all data and is modulated to fit an I-level cell with embedded blank data, wherein the parity data and blank data will have a higher modulation code penalty than parity data embedded with user data.

In another embodiment, a data storage device comprises: one or more memory devices; and a controller coupled to the one or more memory devices, wherein the controller is configured to: generate parity data for a first set of modulated user data; and embed the parity data with a second set of modulated user data that is different from the first set of modulated user data. The parity data is not encoded and wherein the parity data embedded in the second set of modulated user data is disposed in a location adjacent the first set of modulated user data. The first set of modulated user data does not have parity data embedded therewith and is modulated at Shannon limit. Parity data for the second set of modulated user data is not embedded with any user data. The parity data, the first set of modulated user data, and the second user of modulated user data satisfy a triangular H-matrix construction.

In another embodiment, a data storage device comprises: one or more memory devices; means to store modulated first user data; and means to store parity data for the modulated first user data in a location different than the modulated first user data. The means to store parity data comprises means to embed the parity data with modulated data different from the modulated first user data. The means to store modulated first user data comprises means to store the modulated first user data without embedded parity data. The means to store parity data comprises means to store parity data in a modulated block without any modulated user data.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
one or more memory devices; and
a controller coupled to the one or more memory devices, wherein the controller is configured to:
apply modulation coding to a first set of user data;
write the modulated first set of user data to a first modulation block;
generate first parity data for the modulated first set of user data; and
write the first parity data to a second modulation block, wherein the first modulation block does not include parity data, and wherein the second modulation block is configured to store parity data and either:
user data; or
modulated user data.

2. The data storage device of claim 1, wherein the controller is further configured to write a second set of user data that is different from the modulated first set of user data to the second modulation block.

3. The data storage device of claim 2, wherein the first parity data is written to the second modulation block prior to storing the second set of user data in the second modulation block.

4. The data storage device of claim 1, wherein the second modulation block contains no modulated data.

5. The data storage device of claim 1, wherein the first parity data is not encoded.

6. The data storage device of claim 1, wherein the first parity data is embedded in the second modulation block with modulated data that does not correspond to the modulated first set of user data.

7. The data storage device of claim 1, wherein the one or more memory devices comprises a plurality of cells, wherein each cell of the plurality of cells includes a plurality of levels, and wherein a number of levels of the plurality of levels is a non-integer power of 2.

8. The data storage device of claim 7, wherein:
the plurality of cells includes a first portion having a first number of cells and a second portion having a second number of cells;
the first number of cells includes a first number of levels and the second number of cells includes a second number of levels; and
the second number of levels is one more than the first number of levels.

9. The data storage device of claim 8, wherein each cell comprises 5 bits.

10. A data storage device, comprising:
one or more memory devices; and
a controller coupled to the one or more memory devices, wherein the controller is configured to:
apply modulation coding to a first set of user data;
write the modulated first set of user data to a first modulation block;
generate first parity data for the modulated first set of user data; and
write the first parity data to a second modulation block, wherein the first modulation block does not include the first parity data, wherein:
the one or more memory devices comprises a plurality of cells;
each cell of the plurality of cells includes a plurality of levels;
a number of levels of the plurality of levels is a non-integer power of 2;
the number of levels is configured as either:
a first number of levels; or
a second number of levels;
the second number of levels is greater than the first number of levels;
each cell comprises 5 bits; and
parity data embedded with user data in a modulation block comprises about 30% of all data and is modulated at a Shannon limit taking into account a fixed parity bit constraint.

11. The data storage device of claim 10, wherein parity data not embedded with user data in a modulation block comprises about 1% of all data and is modulated to fit an I-level cell with embedded blank data, wherein the parity data and blank data will have a higher modulation code penalty than parity data embedded with user data.

12. A data storage device, comprising:
one or more memory devices; and
a controller coupled to the one or more memory devices, wherein the controller is configured to:
generate first parity data for a first set of modulated user data, wherein the first set of modulated user data is stored in a first modulation block, and wherein the first modulation block does not include parity data; and
embed the first parity data with a second set of modulated user data that is different from the first set of modulated user data, wherein the first parity data is not embedded in the first set of modulated user data, and wherein the second set of modulated user data including the embedded first parity data is stored in a second modulation block, and wherein the second modulation block is configured to store parity data and either:
user data; or
modulated user data.

13. The data storage device of claim 12, wherein the first parity data is not encoded and wherein the parity data embedded in the second set of modulated user data is disposed in a location adjacent the first set of modulated user data.

14. The data storage device of claim 12, wherein the first set of modulated user data does not have parity data embedded therewith.

15. The data storage device of claim 12, wherein the parity data, the first set of modulated user data, and the second user of modulated user data satisfy a triangular H-matrix construction.

16. A data storage device, comprising:
one or more memory devices; and
a controller coupled to the one or more memory devices, wherein the controller is configured to:
generate parity data for a first set of modulated user data; and
embed the parity data with a second set of modulated user data that is different from the first set of modulated user data, wherein the parity data is not embedded in the first set of modulated user data, and wherein parity data for the second set of modulated user data is not embedded with any user data.

17. A data storage device, comprising:
one or more memory means; and
a controller coupled to the one or more memory means, wherein the controller is configured to:
generate modulated first user data and first parity data associated with the modulated first user data, wherein a modulation code is applied to first user data to generate the modulated first user data;
store the modulated first user data, wherein the modulated first user data is not stored with the first parity data associated with the modulated first user data, and wherein a storage location of the modulated first user data does not include parity data; and
store the first parity data associated with the modulated first user data in a storage location different than the modulated first user data, wherein the storage location different is used for storage of modulated second user data, and wherein the storage location different is configured to store parity data and either:
user data; or
modulated user data.

18. The data storage device of claim 17, wherein storing parity data comprises embedding the parity data with modulated data different from the modulated first user data.

19. The data storage device of claim 17, wherein storing modulated first user data comprises storing the modulated first user data without embedded parity data.

20. A data storage device, comprising:
one or more memory means; and
a controller coupled to the one or more memory means, wherein the controller is configured to:
generate modulated first user data and parity data associated the modulated first user data, wherein a modulation code is applied to first user data to generate the modulated first user data;
store the modulated first user data, wherein the modulated first user data is not stored with the parity data associated with the modulated first user data; and
store the parity data associated with the modulated first user data in a location different than the modulated first user data, wherein the location different is used for storage of modulated second user data, and wherein storing parity data comprises storing parity data in a modulated block without any modulated user data.

\* \* \* \* \*